US007514372B2

(12) United States Patent
Arena et al.

(10) Patent No.: US 7,514,372 B2
(45) Date of Patent: Apr. 7, 2009

(54) EPITAXIAL GROWTH OF RELAXED SILICON GERMANIUM LAYERS

(75) Inventors: Chantal Arena, Mesa, AZ (US); Pierre Tomasini, Tempe, AZ (US); Nyles Cody, Tempe, AZ (US); Matthias Bauer, Riederich (DE)

(73) Assignee: ASM America, Inc., Phoenix, AZ (US)

(*) Notice: Subject to any disclaimer, the term of this patent is extended or adjusted under 35 U.S.C. 154(b) by 546 days.

(21) Appl. No.: 10/898,021

(22) Filed: Jul. 23, 2004

(65) Prior Publication Data

US 2005/0051795 A1      Mar. 10, 2005

Related U.S. Application Data

(60) Provisional application No. 60/491,029, filed on Jul. 30, 2003.

(51) Int. Cl.
    H01L 21/31 (2006.01)
(52) U.S. Cl. ............... 438/761; 438/763; 257/E21.09; 257/E21.092; 257/E21.102
(58) Field of Classification Search ............ 438/149, 438/590, 483, 150, 761, 763; 257/E21.09, 257/E21.092, E21.102
    See application file for complete search history.

(56) References Cited

U.S. PATENT DOCUMENTS

| 5,221,413 | A | * | 6/1993 | Brasen et al. ............... 117/89 |
| 5,256,550 | A | * | 10/1993 | Laderman et al. ........... 438/509 |
| 5,442,205 | A | * | 8/1995 | Brasen et al. ............... 257/191 |
| 5,891,769 | A | * | 4/1999 | Liaw et al. .................. 438/167 |
| 6,030,894 | A | * | 2/2000 | Hada et al. .................. 438/675 |
| 6,107,653 | A | * | 8/2000 | Fitzgerald ................... 257/191 |
| 6,455,871 | B1 | * | 9/2002 | Shim et al. .................. 257/12 |
| 6,573,126 | B2 | * | 6/2003 | Cheng et al. ................. 438/149 |
| 6,713,326 | B2 | * | 3/2004 | Cheng et al. ................. 438/149 |
| 6,844,213 | B2 | * | 1/2005 | Sparks ........................ 438/41 |
| 6,855,649 | B2 | * | 2/2005 | Christiansen et al. ....... 438/311 |

(Continued)

FOREIGN PATENT DOCUMENTS

EP         0858101        2/1998

(Continued)

OTHER PUBLICATIONS

Cannon, D. et al., "Tensile strained epitaxial Ge films of Si(100) substrates with potential application in L-band telecommunications," Applied Physics Letter, vol. 84, No. 6, Feb. 9, 2004, pp. 906-908.

(Continued)

Primary Examiner—Alexander G Ghyka
Assistant Examiner—Stanetta D Isaac
(74) Attorney, Agent, or Firm—Knobbe Martens Olson & Bear LLP

(57) ABSTRACT

A relaxed silicon germanium structure comprises a silicon buffer layer produced using a chemical vapor deposition process with an operational pressure greater than approximately 1 torr. The relaxed silicon germanium structure further comprises a silicon germanium layer deposited over the silicon buffer layer. The silicon germanium layer has less than about $10^7$ threading dislocations per square centimeter. By depositing the silicon buffer layer at a reduced deposition rate, the overlying silicon germanium layer can be provided with a "crosshatch free" surface.

46 Claims, 10 Drawing Sheets

U.S. PATENT DOCUMENTS

| | | | |
|---|---|---|---|
| 6,858,502 | B2* | 2/2005 | Chu et al. ............... 438/285 |
| 6,875,279 | B2 | 4/2005 | Chu et al. |
| 6,995,076 | B2* | 2/2006 | Wang et al. ............. 438/478 |
| 2002/0168868 | A1 | 11/2002 | Todd |
| 2003/0445063 | | 3/2003 | Hernandez et al. |
| 2003/0082300 | A1 | 5/2003 | Todd et al. |
| 2003/0124818 | A1 | 7/2003 | Luo et al. |
| 2003/0157787 | A1 | 8/2003 | Murthy et al. |
| 2003/0207127 | A1 | 11/2003 | Murthy et al. |
| 2003/0235931 | A1 | 12/2003 | Wada et al. |
| 2004/0097022 | A1 | 5/2004 | Werkhoven et al. |
| 2004/0217845 | A1* | 11/2004 | Silver et al. ............. 338/25 |
| 2005/0079692 | A1 | 4/2005 | Samoilov et al. |

FOREIGN PATENT DOCUMENTS

WO     WO 00/15885     3/2000

OTHER PUBLICATIONS

Colace, L. et al., "Efficient high-speed near-infrared Ge photodetectors integrated in Si substrates," Applied Physics Letters, vol. 76, No. 10, Mar. 6, 2000, pp. 1231-1233.

Colace, L. et al., "Ge-on-Si Approaches to the Detection of Near-Infrared Light," IEEE Journal of Quantum Electronics, vol. 35, No. 12, Dec. 1999, pp. 1843-1852.

Fama, S. et al., "High performance germanium-on silicon detectors for optical communications," Applied Physics Letters, vol. 81, No. 4, Jul. 22, 2002, pp. 586-588.

Hull, R., "Metastable strained layer configurations in the SiGe/Si System," (1999) *EMIS Datareviews, Series No. 24 of SiGe and SiGe:C*, edited by Erich Kasper et al., INSPEC (2000), London, UK.

Ishikawa, Y. et al., "Strain-induced band gap shrinkage in Ge grown on Si substrate," Applied Physics Letters, vol. 82, No. 12, Mar. 31, 2003, pp. 2044-2046.

Lee et al., "Growth of strained Si and strained Ge heterostructures on relaxed $Si_{1x}G_{ax}Ga$ by ultrahigh vacuum chemical vapor deposition," J. Vac. Sci. Technol. B 22(1) (Jan./Feb. 2004).

Li, Q, et al., "Selective growth of Ge on Si(100) through vias of SiO2 nanotemplate using solid source molecular beam epitaxy," Applied Physics Letters, vol. 83, No. 24, Dec. 15, 2003, pp. 5032-5034.

Liu, J. et al., "Silicidation -induced band gap shrinkage In Ge epitaxial films on Si," Applied Physics Letters, vol. 84, No. 5, Feb. 2, 2004, pp. 660-662.

Masini, G. et al., "High-Performance p-i-n Ge on Si Photodetectors for the Near Infrared: From Model to Demonstration," IEEE Transactions of Electron Devices, vol. 48, No. 6, Jun. 2001, pp. 1092-1096.

Schollhorn et al., "Coalescence of geranium islands on silicon," Thin Solid Films, vol. 336 (1988), pp. 109-111.

Delhougne et al., "Development of a New Type of SiGe Thin Strain Relaxed Buffer Based on the Incorporation of a Carbon-Containing Layer", Applied Surface Science 224:91-94 (2004).

Hackbarth et al., "Alternatives to Thick MBE-Grown Relaxed SiGe Buffers", Thin Solid Films 369:148-151 (2000).

Liu et al., "Experimental Study of a Surficant-Assisted SiGe Graded Layer and a Symmetrically Strained Si/Germanium Superlattic for Thermoelectric Applications", Thin Solid Films 369:121-125 (2000).

Osten et al., "Relaxed $Si_{1-x}Ge_x/Si_{1-x-y}Ge_xC_y$ Buffer Structures with Low Threading Dislocation Density", Applied Physics Letters 70:2813-2815 (1997).

Vescan et al., "Relaxation Mechanism of Low Temperature SiGe/Si(100) Buffer Layers", ICSI3, p. 141 (Mar. 2003).

U.S. Appl. No. 10/800,390, filed Mar. 12, 2004.

* cited by examiner

EPITAXIAL GROWTH OF RELAXED SILICON GERMANIUM LAYERS

PRIORITY APPLICATION

This application claims the benefit of U.S. Provisional Patent Application 60/491,029, filed 30 Jul. 2003, the entire disclosure of which is hereby incorporated by reference herein.

This application is also related to U.S. Provisional Patent Application 60/455,226 (filed 13 Mar. 2003), U.S. Provisional Patent Application 60/470,584 (filed 14 May 2003), and U.S. patent application Ser. No. 10/800,390 (filed 12 Mar. 2004). The entire disclosure of these three related applications are also hereby incorporated by reference herein.

FIELD OF THE INVENTION

The present invention relates generally to the formation of silicon germanium layers in a chemical vapor deposition process, and relates more specifically to epitaxial growth of relaxed silicon germanium layers.

BACKGROUND OF THE INVENTION

Strained semiconductor materials advantageously provide improved electrical carrier mobility properties as compared to relaxed semiconductor materials, thus increasing the speed at which semiconductor circuits can operate. A semiconductor layer is said to be "strained" when it is constrained to have a lattice structure in at least two dimensions that is the same as that of the underlying single crystal substrate, but different from its inherent lattice constant. Lattice strain occurs because the atoms in the deposited film depart from the positions normally occupied when the material is deposited over an underlying structure having a matching lattice structure. The degree of strain in a deposited layer is related to several factors, including the thickness of the deposited layer and the degree of lattice mismatch between the deposited material and the underlying structure.

Strained semiconductor layers can be formed by epitaxially depositing silicon over a silicon germanium layer. Silicon germanium ($Si_{1-x}Ge_x$, where $0 \leq x \leq 1$) films are used in a wide variety of semiconductor applications, such as in microelectronics fabrication. Because silicon germanium has a larger lattice constant than silicon, when epitaxial silicon germanium deposition occurs over silicon (such as during deposition on a silicon wafer), the epitaxially deposited silicon germanium is "strained" to the smaller underlying silicon lattice. If a strained silicon layer is to be deposited over the silicon germanium layer, the silicon germanium layer should first be "relaxed" to its native lattice dimensions so that the silicon layer deposited thereover will be strained. In particular, because a strained silicon germanium layer has the dimensions of the underlying silicon lattice, a silicon layer deposited over a strained silicon germanium layer will not be strained. In contrast, a silicon layer deposited over a "relaxed" silicon germanium layer will be strained to conform to the larger underlying silicon germanium lattice. Thus, a strained silicon layer can be produced by epitaxially depositing silicon over a relaxed silicon germanium layer.

As the thickness of a strained silicon germanium layer increases beyond a "critical thickness", defects in the crystal structure of the strained silicon germanium layer appear, thereby inducing relaxation. After relaxation occurs, the degree of strain present in the silicon germanium layer is related to the amount of misfit dislocation generated in the layer during relaxation, which is a function of the elastic energy of the layer and the activation energy for dislocation nucleation and gliding. The critical thickness depends on a variety of factors, including growth rates, growth temperature, germanium concentration, and the number of defects within the layer underlying the silicon germanium layer. Unfortunately, relaxation often accompanies vertically propagating threading dislocations, which can adversely affect device operation.

SUMMARY OF THE INVENTION

In one embodiment of the present invention, a relaxed silicon germanium structure comprises a silicon buffer layer produced using a chemical vapor deposition process with an operational pressure greater than approximately 1 torr. The relaxed silicon germanium structure further comprises a silicon germanium layer deposited over the silicon buffer layer. The silicon germanium layer has less than about $10^7$ threading dislocations per square centimeter.

In another embodiment of the present invention, a method of producing a relaxed silicon germanium structure comprises epitaxially depositing a silicon-containing layer using a chemical vapor deposition process with an operational pressure greater than approximately 1 torr. The method further comprises heteroepitaxially depositing a germanium-containing layer over the silicon-containing layer. The germanium-containing layer has a lattice constant that differs from a lattice constant of the silicon-containing layer. The germanium-containing layer has a surface roughness that is less than approximately 3 nm rms.

In another embodiment of the present invention, a method of producing a relaxed semiconductor structure comprises epitaxially depositing a first silicon-containing layer using a chemical vapor deposition process with an operational pressure greater than approximately 1 torr. The method further comprises heteroepitaxially depositing a second silicon-containing layer over the first layer. The second layer has a lattice constant that differs from a lattice constant of the first layer. The second layer has less than about $10^7$ threading dislocations per square centimeter.

In another embodiment of the present invention, a method comprises epitaxially depositing a first silicon-containing layer using a chemical vapor deposition process with an operational pressure greater than approximately 1 torr. The first layer has a plurality of point defects. The method further comprises heteroepitaxially depositing a second silicon-containing layer over the first layer. The second silicon-containing layer has less than about $10^7$ threading dislocations per square centimeter.

BRIEF DESCRIPTION OF THE DRAWINGS

Exemplary embodiments of epitaxially grown relaxed silicon germanium layers are illustrated in the accompanying drawings, which are for illustrative purposes only. The drawings comprise the following figures, in which like numerals indicate like parts.

DETAILED DESCRIPTION OF PREFERRED EMBODIMENTS

As used herein, the terms "single-crystal" and "epitaxial" are used to describe a predominantly large crystal structure that may have a tolerable number of faults therein. Crystallinity of a layer generally falls along a continuum from amorphous to polycrystalline to single-crystal, and therefore a crystal structure is often considered single-crystal or epitaxial notwithstanding a low density of faults. The term "epitaxy" refers to deposition where the deposited layer serves as an extension of the crystal structure of an underlying layer. "Heteroepitaxy" is a species of epitaxy in which the underlying layer and the overlying deposited layer are of different materials.

Figure 3:
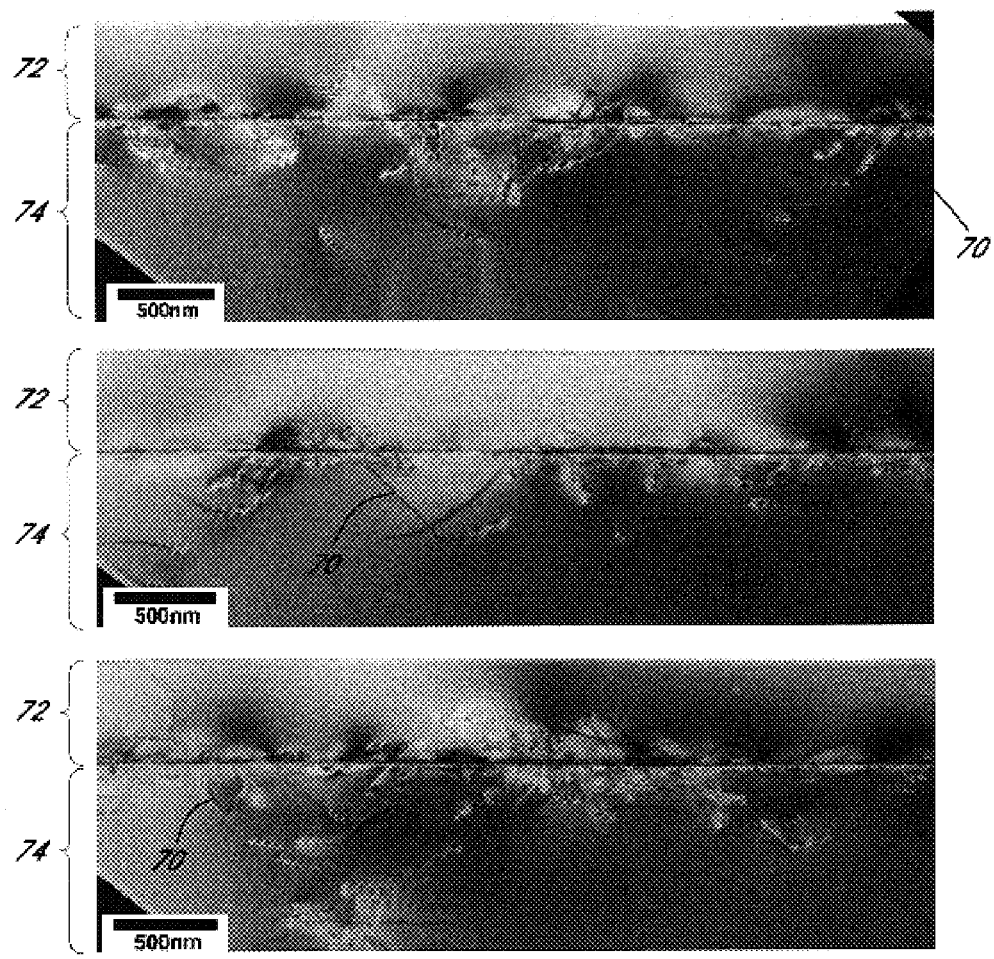
FIG. 3 is a series of transmission electron microscope ("TEM") images of a $Si_{0.8}Ge_{0.2}$ layer grown directly on a silicon substrate, wherein an increased density of threading dislocations is present.

As described above, as the thickness of a strained silicon germanium layer increases beyond the critical thickness, defects in the crystal structure of the strained silicon germanium layer appear, thus leading to relaxation of the strained layer. Such defects can include threading dislocations. Generally, threading dislocations, which propagate perpendicular to and away from the interface with the underlying silicon buffer layer, disadvantageously cause reduced carrier mobility, current leakage, reduced device performance and even device failure. FIG. 3 illustrates several examples of threading dislocations 70 extending vertically when a $Si_{0.8}Ge_{0.2}$ layer 72 is deposed directly on an underlying silicon substrate 74. Disclosed herein are techniques for creating a thin, relaxed silicon germanium layer having a reduced density of threading dislocations.

Conventionally, a reduction in threading dislocation density has been accomplished by depositing the silicon germanium over an epitaxially-deposited silicon buffer layer formed using molecular beam epitaxy ("MBE") or ultra high vacuum chemical vapor deposition ("UHVCVD"). See, for example, L. Vescan et al., "Relaxation Mechanism of Low Temperature SiGe/Si(001) Buffer Layers", ICSI3, p. 141 (Santa Fe, March 2003). Using such techniques, the underlying silicon buffer layer is grown at a low temperature, such as between 300° C. and 500° C. This low temperature deposition process causes point defects to be incorporated into the silicon buffer layer. When a silicon germanium layer is formed thereover, the presence of the point defects causes the silicon germanium layer to relax at a reduced critical thickness without creating a high density of threading dislocations.

While use of MBE and UHVCVD techniques to create an underlying silicon buffer layer can advantageously reduce threading dislocation density, they are not compatible with conventional chemical vapor deposition ("CVD") apparatuses and techniques, including remote plasma CVD apparatuses. As used herein "conventional CVD equipment" refers generally to CVD equipment with an operational pressure of greater than 1 torr. Specifically, at lower temperatures generally considered desirable for silicon buffer layer deposition, the silicon growth rates for the underlying buffer layer will be unacceptably low. The resulting inability to grow a relaxed silicon germanium layer with a reduced density of threading dislocations using conventional CVD equipment results in decreased throughput rates and increased fabrication costs. Disclosed herein is an improved technique for creating relaxed silicon germanium layers having a reduced density of threading dislocations using conventional CVD equipment.

In an exemplary embodiment, an epitaxially grown silicon buffer layer is deposited using conventional CVD equipment, and a silicon germanium layer is deposited over the buffer layer. This process is illustrated in the flowchart of FIG. 1, and cross-sectional views of the sequentially deposited layers are illustrated in FIGS. 2A and 2B.

Figure 1:
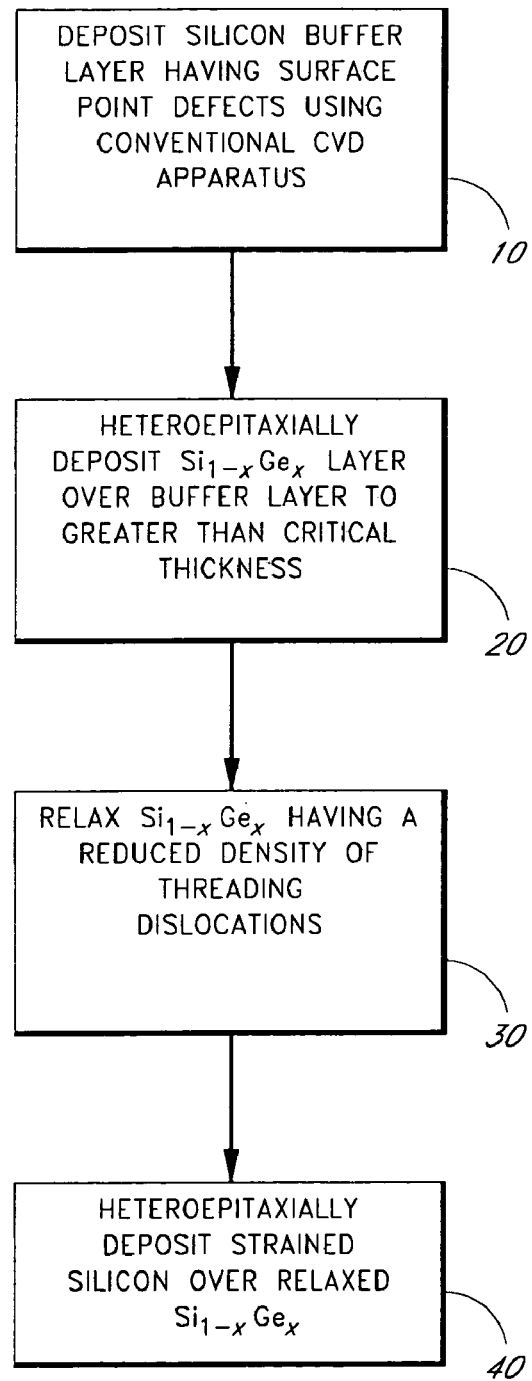
FIG. 1 is a flowchart illustrating an exemplary process for producing heteroepitaxially grown relaxed silicon germanium layers and subsequent strained silicon layers.
Figure 2A:
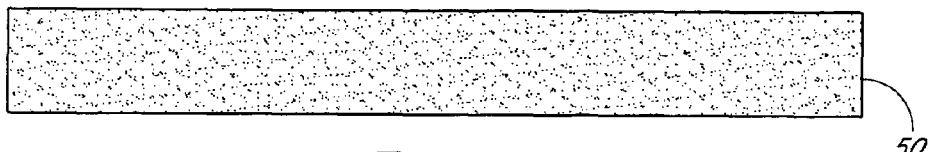
FIG. 2A is a schematic cross-sectional illustration of an exemplary silicon substrate.
Figure 2B:
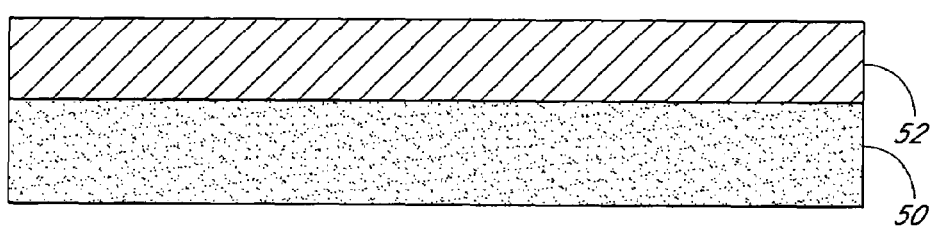
FIG. 2B is a schematic cross-sectional illustration of an exemplary silicon buffer layer disposed on the silicon substrate of FIG. 2A.

As illustrated in FIGS. 1, 2A and 2B, a first silicon-containing layer, referred to herein as silicon buffer layer 52, having point defects incorporated therein, is deposited over a substrate 50 using a conventional CVD apparatus in operational block 10. The conventional CVD apparatus preferably has an operational pressure greater than approximately 1 torr, more preferably has an operational pressure greater than approximately 5 torr, and most preferably has an operational pressure greater than approximately 10 torr. In one embodiment, the operational pressure in the CVD apparatus is atmospheric pressure (approximately 760 torr). In another embodiment, the operational pressure is between approximately 10 torr and approximately 50 torr. An acceptable growth rate for the silicon buffer layer 52 is obtained by (a) using a process temperature greater than approximately 500° C., more preferably between approximately 550° C. and approximately 700° C., and most preferably between approximately 600° C. and approximately 700° C., and by (b) using an increased flow rate for the silicon precursor.

For example, for a single wafer processing tool such as the Epsilon 200 system, commercially available for 200 mm wafer processing from ASM America, Inc. (Phoenix, Ariz.), the flow rate for the silicon precursor is greater than approximately 50 sccm, more preferably between approximately 100 sccm and approximately 400 sccm, and most preferably between approximately 200 sccm and approximately 300 sccm. Using these parameters, the underlying silicon buffer layer 52 preferably grows at greater than approximately 0.16 nm min$^{-1}$, more preferably between approximately 3 nm min$^{-1}$ and approximately 10 nm min$^{-1}$, and most preferably between approximately 7 nm min$^{-1}$ and approximately 8 nm min$^{-1}$. These process parameters produce a silicon buffer layer 52 having point defects suitable for depositing a relaxed heteroepitaxial silicon germanium layer thereover.

The structures described herein can also be produced using a batch wafer processing tool, such as the Advance 412 vertical batch furnace system, commercially available from ASM International, N.V. (Bilthoven, The Netherlands). In other embodiments, the silicon buffer layer 52 is produced using a batch process, and then the overlying silicon germanium layer can be produced using a single wafer processing tool, as described above. This arrangement advantageously allows aggregate throughput to be increased because the production of the silicon buffer layer 52 is the slower of the two processes.

The density of point defects within the silicon buffer layer 52 is dependent on the process parameters used to produce the silicon buffer layer 52. Such process parameters include, but are not limited to, chamber temperature and layer growth rate. For example, higher growth rates result in more point defects in the silicon buffer layer 52. Thus, in one embodiment these parameters can be optimized to achieve a point defect density within the silicon buffer layer 52 that is high enough to reduce threading dislocations in the overlying silicon germanium layer, but that is not so high that polycrystalline silicon germanium forms over the silicon buffer layer 52. For example, use of trisilane as a silicon precursor for forming the silicon buffer layer 52 allows higher growth rates for a given temperature, as compared to use of silane. Therefore, use of trisilane can be used to produce a higher point defect density in the silicon buffer layer 52 relative to use of silane under similar conditions.

In still other embodiments, other silicon precursors can be used. For example, boron-doped silicon layers can be grown using dichlorosilane, trichlorosilane or disilane. In such embodiments, a vaporized liquid silicon precursor can be delivered to the reaction chamber. Examples of acceptable vaporized liquid silicon precursors include, but are not limited to, trichlorosilane and disilane. Additional information regarding the use of trisilane for epitaxial deposition can be found in U.S. patent application Publication 2002/0168868, which is hereby incorporated herein in its entirety.

Figure 2C:
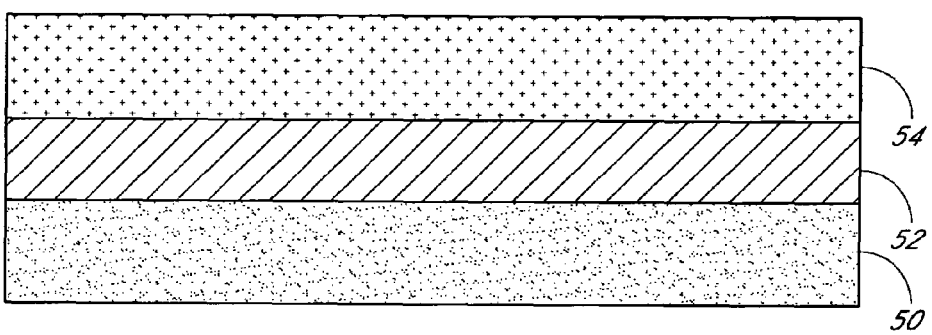
FIG. 2C is a schematic cross-sectional illustration of an exemplary epitaxially grown relaxed silicon germanium layer grown over the silicon buffer layer of FIG. 2B.

Referring now to FIGS. 1 and 2C, a second silicon-containing layer, referred to herein as silicon germanium layer 54, is heteroepitaxially deposited over the silicon buffer layer 52 in operational block 20. When the silicon germanium layer 54 reaches the critical thickness, the silicon germanium layer 54 relaxes in operational block 30. The presence of optimized point defects at the interface between the grown silicon buffer layer 52 and the overlying silicon germanium layer 54 causes the silicon germanium layer 54 to have a reduced critical thickness.

Furthermore, after the silicon germanium layer 54 relaxes, the presence of the point defects causes the resulting relaxed silicon germanium layer 54 to have a reduced density of threading dislocations. For example, in one embodiment, when a $Si_{0.8}Ge_{0.2}$ layer 54 is heteroepitaxially deposited over an epitaxially-grown silicon buffer layer 52 according to the exemplary process parameters set forth herein, the silicon germanium layer 54 preferably has fewer than approximately $10^7$ threading dislocations per cm$^2$, and more preferably has fewer than approximately $10^5$ threading dislocations per cm$^2$. In other embodiments, a reduced density of threading dislocations can be obtained by reducing the germanium concentration in the overlying silicon germanium layer. Likewise, increasing the germanium concentration will increase the strain in the silicon germanium layer, and will thus cause more threading dislocations to form during relaxation.

Figure 4:
FIG. 4 is a TEM image of a $Si_{0.8}Ge_{0.2}$ layer grown over a silicon buffer layer, wherein a reduced density of threading dislocations is present.

FIG. 4 illustrates a relaxed $Si_{0.8}Ge_{0.2}$ layer 54 heteroepitaxially deposited over a silicon buffer layer 52, wherein a reduced density of threading dislocations 70 is present in the $Si_{0.8}Ge_{0.2}$ layer 54. The density of threading dislocations can be estimated by counting etch pits using an optical microscope with Normarski contrast after a standard Schimmel etch of the surface.

Figure 5:
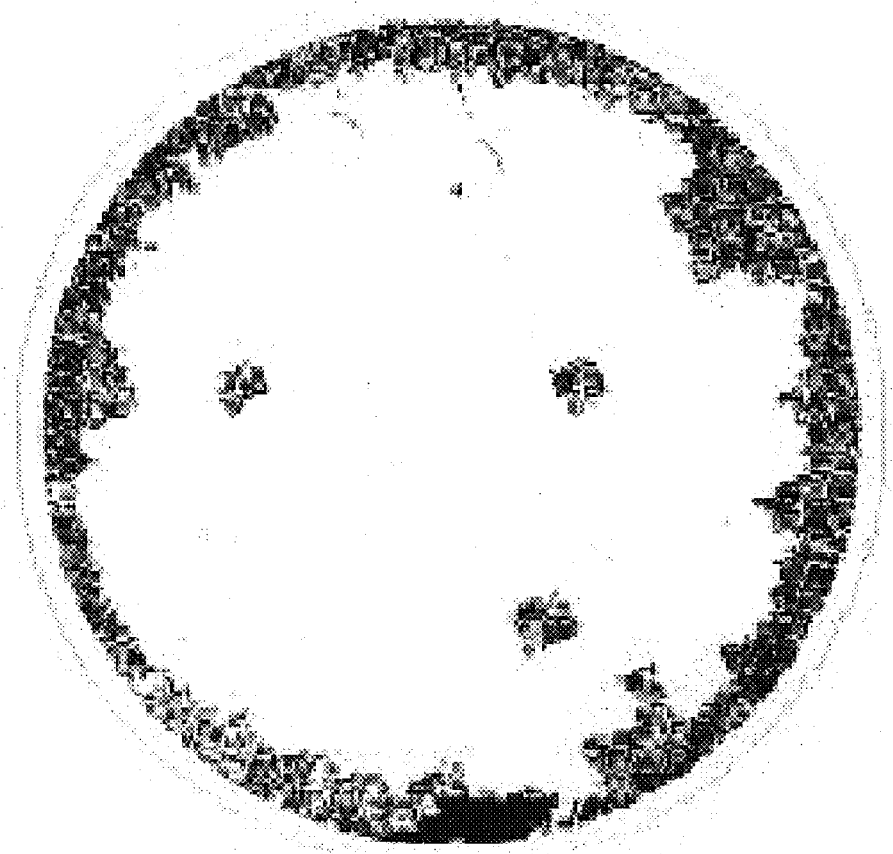
FIG. 5 is a particle detection map of a silicon germanium layer deposited on a silicon wafer at a relatively low growth rate illustrating partial relaxation at the edges of the wafer.
Figure 6:
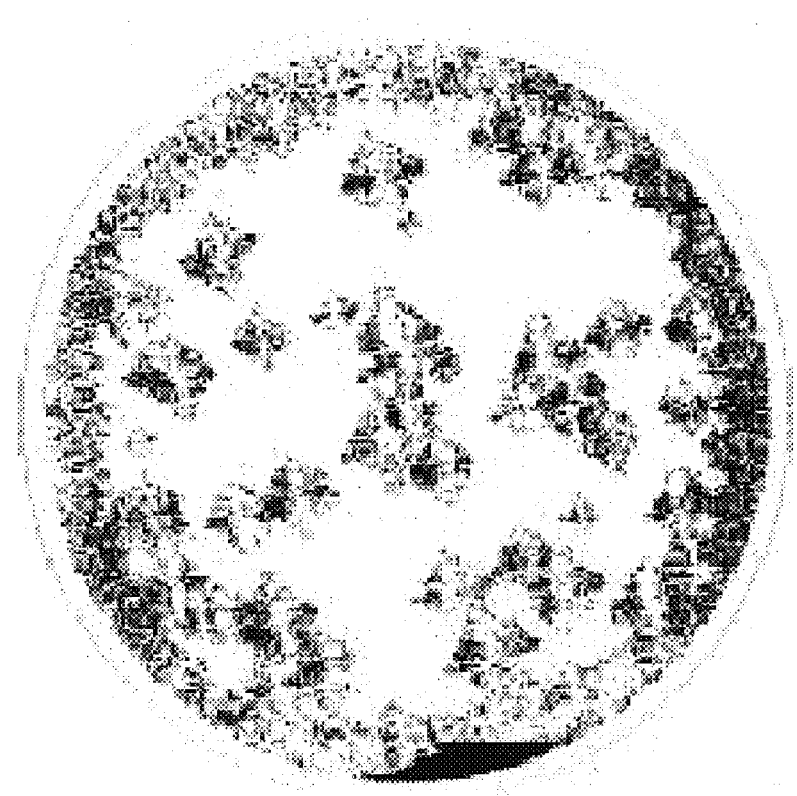
FIG. 6 is a particle detection map of a silicon germanium layer deposited on a silicon wafer at an intermediate growth rate illustrating partial heterogeneous relaxation across the wafer.
Figure 7:
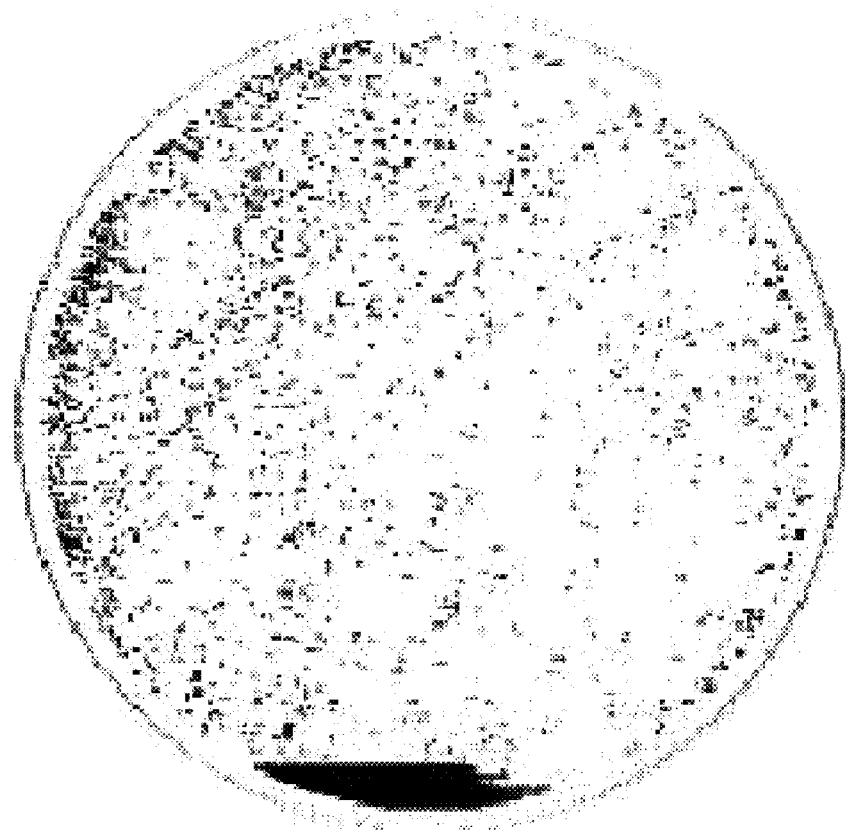
FIG. 7 is a particle detection map of a silicon germanium layer deposited on a silicon wafer at a relatively high growth rate illustrating substantially uniform relaxation across the wafer.

Relaxed silicon germanium layers generally have a slight surface roughness (for example, approximately 1.2 nm rms for a 100 μm$^2$ area of a layer that is approximately 0.5 μm thick) that can be detected using a particle detection tool. FIGS. 5 through 7 illustrate particle detection maps of exemplary $Si_{0.85}Ge_{0.15}$ layers produced using the methods described herein, with the $Si_{0.85}Ge_{0.15}$ layers in various degrees of relaxation. In these particle detection maps, relaxed $Si_{0.85}Ge_{0.15}$ appears as a darkened region. The degree of relaxation is determined by the growth rate of the silicon buffer layer 52, as described above.

For example, the $Si_{0.85}Ge_{0.15}$ layer illustrated in FIG. 5 was heteroepitaxially deposited on a silicon buffer layer 52 having a relatively low growth rate, which caused relatively few point defects to be incorporated therein, thus resulting in relaxation only around the perimeter of the overlying $Si_{0.85}Ge_{0.15}$ layer. The $Si_{0.85}Ge_{0.15}$ layer illustrated in FIG. 6 was heteroepitaxially deposited on a silicon buffer layer 52 having an intermediate growth rate, which resulted in partial heterogeneous relaxation in the overlying $Si_{0.85}Ge_{0.15}$ layer. In contrast to the previous two examples, the $Si_{0.85}Ge_{0.15}$ layer illustrated in FIG. 7 was heteroepitaxially deposited on a silicon buffer layer 52 having a relatively high growth rate, which caused an increased number of point defects to be incorporated therein, thus resulting in substantially uniform relaxation throughout the overlying $Si_{0.85}Ge_{0.15}$ layer. By way of example, the silicon buffer layer 52 underlying the $Si_{0.85}Ge_{0.15}$ layer illustrated in FIG. 7 is approximately 37 nm thick, was grown at approximately 8 nm min$^{-1}$ at approximately 600° C. using silane at approximately 200 sccm.

Figure 2D:
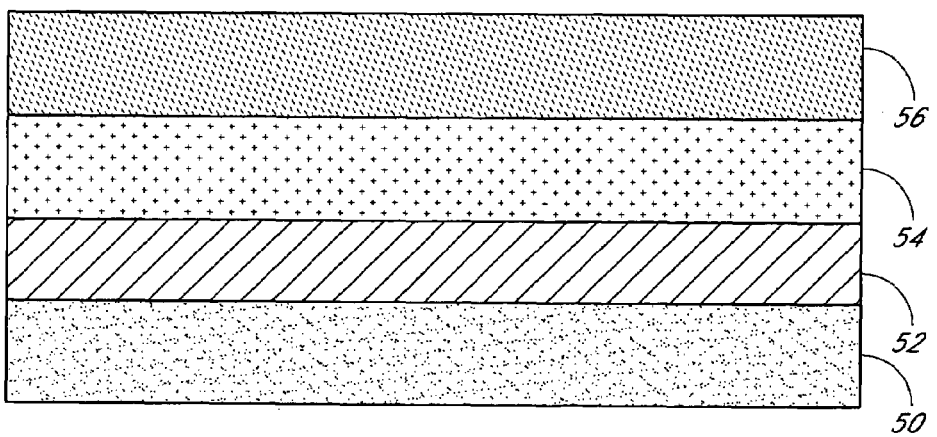
FIG. 2D is a schematic cross-sectional illustration of an exemplary strained silicon layer disposed on the relaxed silicon germanium layer of FIG. 2C.

The relaxed silicon germanium layer 54 is preferably covered by a heteroepitaxially-grown tensile strained silicon layer 56 in operational block 40, as illustrated in FIGS. 1 and 2D. The tensile strained silicon layer 56 provides improved electrical carrier mobility in devices fabricated from the structures described herein. For example, in transistor fabrication, the tensile strained silicon layer 56 allows transistors having faster response times to be fabricated. In a modified embodiment, the silicon germanium layer is planarized before depositing the tensile strained silicon layer 56 thereover, such as for example using a chemical mechanical planarization process. In another embodiment, the relaxed silicon germanium layer 54 is covered by a heteroepitaxially-grown compressive strained germanium layer. Likewise, the relaxed silicon germanium layer 54 can be covered by a heteroepitaxially-grown compressive strained silicon germanium layer with high germanium content.

The underlying silicon buffer 52 layer described herein, which can be produced using conventional CVD equipment, can also underlie other relaxed structures with reduced threading dislocation densities. For example, silicon germanium structures having varying germanium content ($Si_{1-x}Ge_x$, where $0 \leq x \leq 1$) can be deposited over the underlying silicon buffer layer 52, as well as carbon-doped silicon germanium structures, such as $Si_{1-x-y}Ge_xC_y$ structures. The silicon buffer layer 52 described herein can also be used to create strained silicon on insulator ("SOI") structures. Likewise, a variety of epitaxial growth techniques can be used to create the underlying silicon buffer layer 52, including blanket epitaxy and selective epitaxy.

The use of conventional CVD equipment also advantageously allows for in situ sequential deposition of the silicon buffer layer 52, the silicon germanium layer 54 and the strained silicon layer 56 (or other overlying semiconductor layer) in the same processing chamber without intervening treatments. This provides improved processing throughput and better purity. In one embodiment, however, the silicon buffer layer can be deposited in one tool serially, or as a batch on a batch of wafers. The batch (for example, 25 wafers) can be transferred to a separate silicon germanium deposition chamber within the same cluster tool or back to the same tool. A batch of wafers with silicon buffer layers can be transported to a hydrofluoric acid dip (or other appropriate cleaning process) followed by transportation to a separate tool for silicon germanium deposition (serially or simultaneously as a batch). An advantage of such a process is that no cooling or heating cycles are required between silicon and silicon germanium deposition temperatures.

Typically, when the silicon germanium layer 54 relaxes as described above, a crosshatch topology is formed on the surface thereof. The crosshatch topology consists of periodic ridges aligned along orthogonal <110> surface directions. The ridges, which expand both laterally and horizontally with thickness, have a symmetric cross-section with rounded tops. While ordinarily considered a natural consequence of relaxation, without regard for the defect density, the inventors have determined that this crosshatch topology of the silicon germanium layer 54 can be reduced or eliminated by manipulation of the underlying silicon buffer layer 52. A silicon germanium layer with a reduced or eliminated crosshatch topology is referred to herein as a "crosshatch free" layer.

In one such embodiment of making a "crosshatch free" silicon germanium layer, the silicon buffer layer 52 can be grown at a reduced growth rate, and therefore can have a reduced thickness. For example, the silicon buffer layer 52 can be grown at a rate that is less than approximately 1.0 nm min$^{-1}$, less than approximately 0.50 nm min$^{-1}$, or as low as approximately 0.16 nm min$^{-1}$. In one embodiment, the silicon buffer layer 52 is grown at a rate between approximately 0.20 nm min$^{-1}$ and approximately 1.0 nm min$^{-1}$.

When these reduced growth rates are used, the silicon buffer layer 52 can be grown to a thickness less than approximately 3.0 nm, less than approximately 2.0 nm, or even as low as approximately 1.0 nm. For example, in one embodiment, the silicon buffer layer 52 has a thickness between approximately 1.0 nm and approximately 2.0 nm. In another example embodiment, the silicon buffer layer 52 has a thickness between approximately 1.0 nm and approximately 3.0 nm.

In one embodiment, this reduced growth rate of the silicon buffer layer 52 is accomplished by providing a deposition temperature of approximately 650° C. For example, in one embodiment a deposition temperature between approximately 630° C. and approximately 670° C. is provided, and in another embodiment a deposition temperature between approximately 600° C. and approximately 700° C. is provided.

In another embodiment, the reduced growth rate of the silicon buffer layer 52 is accomplished by decreasing the hydrogen carrier flow rate through the CVD chamber. For example, in one embodiment the hydrogen carrier flow through the CVD chamber is between approximately 5 slm and approximately 15 slm. In one embodiment, the hydrogen carrier flow through the CVD chamber is approximately 10 slm.

The silicon buffer layer 52 can be deposited in either a blanket or a selective deposition process. In a selective deposition process, the amount of etchant, such as hydrochloric acid, added to the CVD chamber is tuned such that there is minimal or no deposition on insulators, while still allowing for epitaxial deposition to occur on exposed semiconductor material.

The deposition of the silicon buffer layer 52 can be tuned to provide an increased density of point dislocations on the buffer layer surface. When the silicon germanium layer 54 is deposited over a surface with a high density of point dislocations, gliding of threading dislocations in the silicon germanium layer is reduced. This allows the silicon germanium layer 54 to essentially grow in a relaxed state, thereby reducing or eliminating the crosshatch topology that usually accompanies the relaxation.

In one embodiment, the increased density of point dislocations in the silicon buffer layer 52 is accomplished by increasing the growth rate and thickness of the silicon buffer layer. However, as described herein, crosshatch free topologies have been obtained with silicon buffer layer growth rates as low as approximately 0.16 nm min$^{-1}$, and silicon buffer layer thicknesses as low as approximately 1.0 nm.

Figure 8:
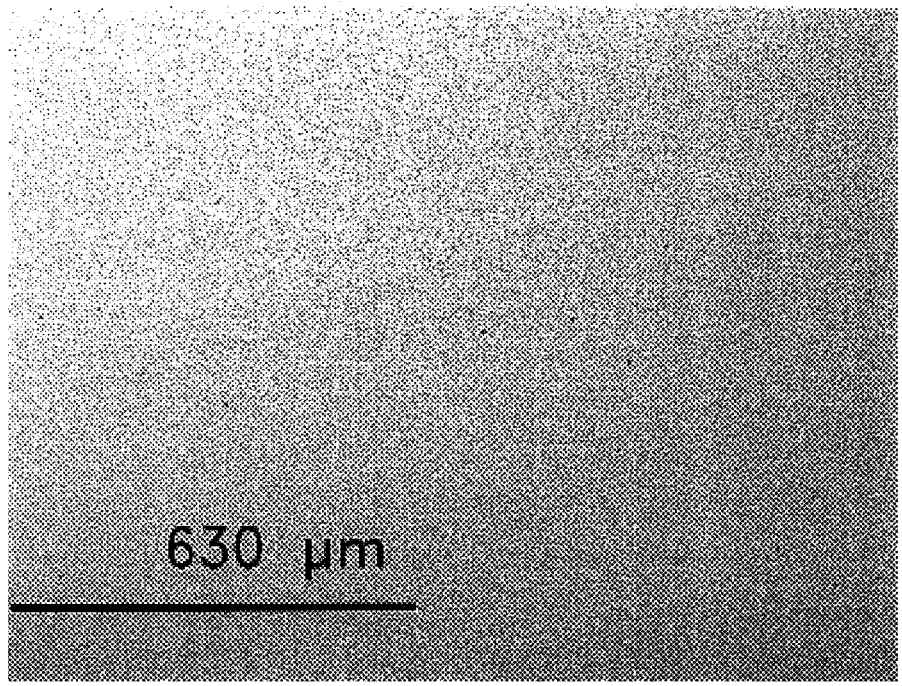
FIG. 8 is an optical microscope photograph of the surface of an exemplary crosshatch free surface of a silicon germanium layer with a thickness of 1.5 μm.
Figure 9:
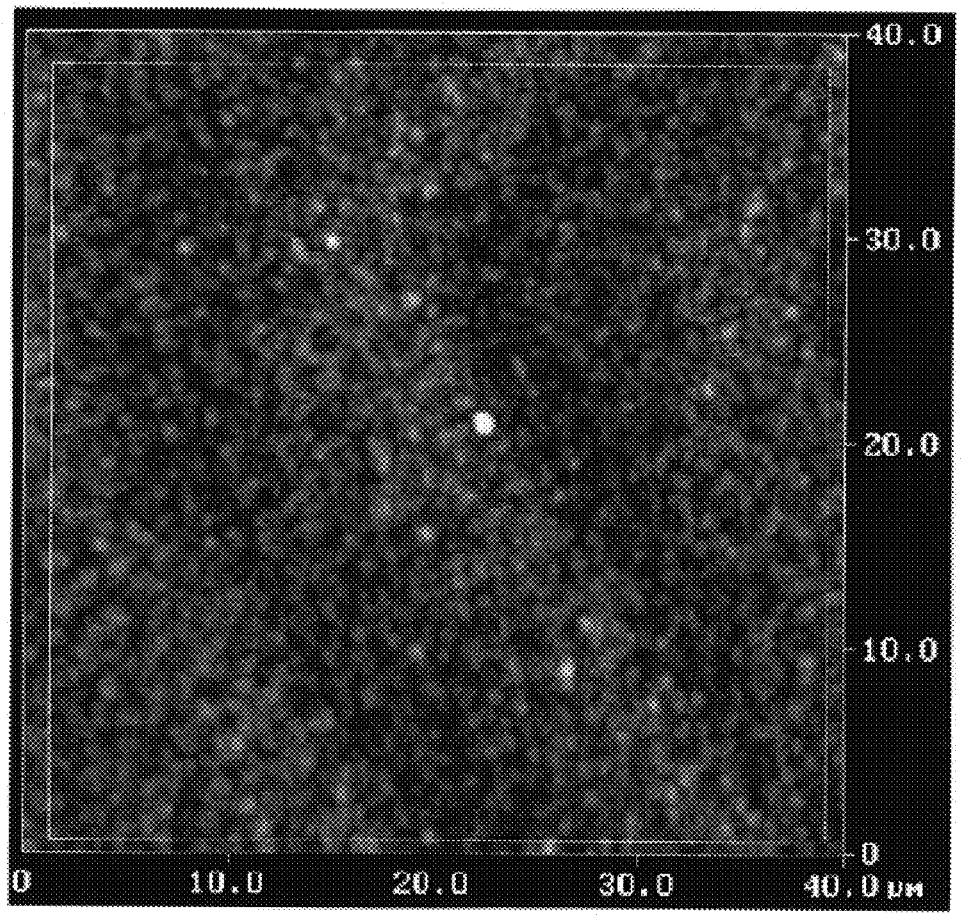
FIG. 9 is an atomic force microscopy image of the silicon germanium surface of FIG. 8.
Figure 10:
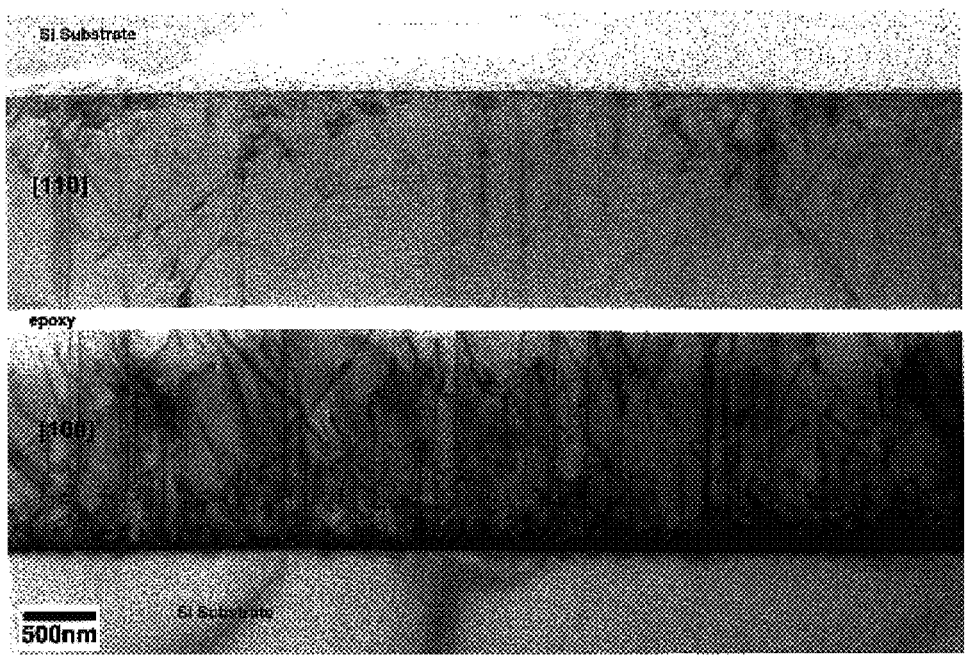
FIG. 10 is a cross-sectional view taken along the <110> and <100> crystallographic orientations of an exemplary silicon germanium layer having a crosshatch free surface.

For example, in one embodiment, a 1.5 μm thick silicon germanium layer having a surface roughness of 1.3 nm rms can be produced using the reduced thickness silicon buffer layer described herein. A surface photograph of such a layer, taken using an optical microscope, is provided in FIG. 8. This photograph illustrates the absence of a crosshatch topology. An atomic force microscopy image of such an exemplary silicon germanium layer is provided in FIG. 9. This figure illustrates a 40 μm×40 μm section of the layer surface, and shows a surface roughness of 1.3 nm rms. A cross-sectional view of this exemplary silicon germanium layer, taken along the <110> and the <100> crystallographic orientations, is provided in FIG. 10. This view shows a high density of threading dislocations within the silicon germanium layer, and also shows a smooth surface for the silicon germanium layer. This view also shows the relative low density of dislocations within the silicon substrate.

Using the process parameters expounded herein, the silicon germanium layer 54 has a surface roughness that is preferably less than approximately 3.0 nm rms, more preferably less than approximately 2.0 nm rms, and most preferably less than approximately 1.5 nm rms. For example, in one embodiment, the silicon germanium layer 54 has a surface roughness between approximately 1.0 nm rms and approximately 3.0 nm rms. In another embodiment, the silicon germanium layer 54 has a surface roughness between approximately 1.0 nm rms and approximately 2.0 nm rms.

SCOPE OF THE INVENTION

While the foregoing detailed description discloses several embodiments of the present invention, it should be understood that this disclosure is illustrative only and is not limiting of the present invention. It should be appreciated that the specific configurations and operations disclosed can differ from those described above, and that the methods described herein can be used in contexts other than epitaxially grown relaxed silicon germanium layers.

We claim
1. A method of producing a relaxed silicon germanium structure, the method comprising:
   epitaxially depositing a silicon-containing layer using a chemical vapor deposition process with an operational pressure greater than approximately 1 torr; and
   heteroepitaxially depositing, to at least a critical thickness, a relaxed germanium-containing layer over the silicon-containing layer, wherein the relaxed germanium-con- taining layer has a lattice constant that differs from a lattice constant of the silicon-containing layer, and wherein the relaxed germanium-containing layer has a surface roughness that is less than approximately 3 nm rms.

2. The method of claim 1, further comprising tuning a process parameter so as to provide the relaxed germanium-containing layer with a crosshatch free surface topology, wherein the process parameter is selected from the group consisting of carrier flow rate, silicon-containing layer deposition rate, silicon-containing layer deposition temperature, and silicon-containing layer paint defect density.

3. The method of claim 2, wherein the relaxed germanium-containing layer is a crosshatch free layer.

4. The method of claim 1, wherein the relaxed germanium-containing layer is a crosshatch free layer.

5. The method of claim 1, wherein the silicon-containing layer has a thickness less than approximately 3 nm.

6. The method of claim 1, wherein the silicon-containing layer has a thickness less than approximately 2 nm.

7. The method of claim 1, wherein the silicon-containing layer has a thickness between approximately 1 nm and approximately 2 nm.

8. The method of claim 1, wherein the relaxed germanium-containing layer has a surface roughness that is less than approximately 2 nm rms.

9. The method of claim 1, wherein the relaxed germanium-containing layer has a surface roughness that is less than approximately 1.5 nm rms.

10. The, method of claim 1, wherein the silicon-containing layer is deposited at a growth rate of less than approximately 1.0 nm $min^{-1}$.

11. The method of claim 1, wherein the silicon-containing layer is deposited at a growth rate of less than approximately 0.50 nm $min^{-1}$.

12. The method of claim 1, wherein the silicon-containing layer is deposited at a growth rate of less than approximately 0.20 nm $min^{-1}$.

13. The method of claim 1, wherein the silicon-containing layer is deposited at a temperature between approximately 630° C. and approximately 670° C.

14. The method of claim 1, further comprising depositing a strained silicon layer over the relaxed germanium-containing layer, wherein the strained silicon layer and the relaxed germanium-containing layer are deposited in situ within a single process chamber.

15. A method of producing a relaxed semiconductor structure comprising:
  epitaxially depositing a first silicon-containing layer using a chemical vapor deposition process with an operational pressure greater than approximately 1 torr; and
  heteroepitaxially depositing, to at least a critical thickness, a second silicon-containing layer over the first layer, wherein the second layer has a lattice constant that differs from a lattice constant of the first layer, wherein the second silicon-containing layer is relaxed, and wherein the second layer has less than about $10^7$ threading dislocations per square centimeter.

16. The method of claim 15, further comprising tuning a process parameter so as to provide the second silicon-containing layer with a crosshatch free surface topology, wherein the process parameter is selected from the group consisting of carrier flow rate, first silicon-containing layer deposition rate, first silicon-containing-layer deposition temperature, and first silicon-containing layer point defect density.

17. The method of claim 16, wherein the second silicon-containing layer is a crosshatch free layer.

18. The method of claim 17, wherein the second layer is a crosshatch free layer.

19. The method of claim 15, wherein the first layer is deposited to a thickness of between approximately 1 nm and approximately 2 nm.

20. The method of claim 15, wherein the first layer is deposited at a deposition rate of less than approximately 0.20 nm $min^{-1}$.

21. The method of claim 15, wherein the first layer is deposited at a deposition rate of less than approximately 1.0 nm $min^{-1}$.

22. The method of claim 15, wherein the first layer is deposited at a deposition rate between approximately 0.20 nm $min^{-1}$ and approximately 10.0 nm $min^{-1}$.

23. The method of claim 15, wherein the first layer is deposited at a deposition rate between about 7.0 nm $min^{-1}$ and about 8.0 nm $min^{-1}$.

24. The method of claim 15, further comprising depositing a tensile strained layer over the second silicon-containing layer.

25. The method of claim 15, further comprising depositing a compressive strained layer over the second silicon-containing layer.

26. The method of claim 15, wherein depositing the first silicon-containing layer comprises providing a vaporized liquid silicon precursor to a chemical vapor deposition chamber.

27. The method of claim 15, wherein the second silicon-containing layer comprises a silicon germanium layer.

28. A method comprising:
  epitaxially depositing a silicon-containing buffer layer using a chemical vapor deposition process with an operational pressure greater than approximately 1 torr, the buffer layer having a plurality of point defects; and
  heteroepitaxially depositing, to at least a critical thickness, a silicon-containing relaxed layer over the buffer layer, the relaxed layer having less than about $10^7$ threading dislocations per square centimeter.

29. The method of claim 28, further comprising tuning a process parameter so as to provide the relaxed layer with a crosshatch free surface topology, wherein the process parameter is selected from the group consisting of carrier flow rate, buffer layer deposition rate, buffer layer deposition temperature, and buffer layer point defect density.

30. The method of claim 29, wherein the relaxed layer is a crosshatch free layer.

31. The method of claim 28, wherein the relaxed layer is a crosshatch free layer.

32. The method of claim 28, wherein the buffer layer is deposited at a temperature greater than approximately 500° C.

33. The method of claim 28, wherein the buffer layer is deposited at a temperature between approximately 550° C. and approximately 700° C.

34. The method of claim 28, wherein the buffer layer is deposited at a temperature between approximately 600° C. and approximately 700° C.

35. The method of claim 28, wherein depositing the buffer layer comprises providing a silicon precursor to a chemical vapor deposition chamber at between approximately 200 sccm and approximately 300 sccm.

36. The method of claim 28, wherein depositing the buffer layer comprises providing a vaporized liquid silicon precursor to a chemical vapor deposition chamber.

37. The method of claim 28, wherein the chemical vapor deposition process is performed in a single wafer chamber, and wherein depositing the buffer layer comprises providing a silicon precursor to the chamber at greater than approximately 50 sccm.

38. The method of claim 28, wherein the buffer layer is deposited at a rate less than approximately 0.2 nm min$^{-1}$.

39. The method of claim 28, wherein the buffer layer is deposited at a rate between approximately 5.0 nm min$^{-1}$ and approximately 10.0 nm min$^{-1}$.

40. The method of claim 28, wherein the buffer layer is deposited at a deposition rate between approximately 7.0 nm min$^{-1}$ and approximately 8.0 nm min$^{-1}$.

41. The method of claim 28, wherein the buffer layer comprises a silicon buffer layer.

42. The method of claim 28, wherein the relaxed layer comprises a silicon germanium layer.

43. The method of claim 28, further comprising depositing a silicon-containing capping layer that is strained, the capping layer directly overlying the relaxed layer.

44. The method of claim 43, wherein the relaxed and capping layers are sequentially formed in situ within a single process chamber.

45. The method of claim 43, wherein the buffer, relaxed and capping layers are sequentially farmed in situ within a single process chamber.

46. The method of claim 28, wherein the buffer and relaxed layers are sequentially formed in situ within a single process chamber.

* * * * *

UNITED STATES PATENT AND TRADEMARK OFFICE
CERTIFICATE OF CORRECTION

| | | |
|---|---|---|
| PATENT NO. | : 7,514,372 B2 | Page 1 of 1 |
| APPLICATION NO. | : 10/898021 | |
| DATED | : April 7, 2009 | |
| INVENTOR(S) | : Chantal Arena et al. | |

It is certified that error appears in the above-identified patent and that said Letters Patent is hereby corrected as shown below:

In Claim 2 at Col. 9, line 12, delete "paint" and insert -- point --, therefore.

In Claim 18 at Col. 10, line 1, delete "17" and insert -- 15 --, therefore.

In Claim 45 at Col. 12, line 9, delete "farmed" and insert -- formed --, therefore.

Signed and Sealed this
Twenty-fourth Day of May, 2011

David J. Kappos
*Director of the United States Patent and Trademark Office*